United States Patent [19]

Oppel et al.

[11] 4,221,972
[45] Sep. 9, 1980

[54] APPARATUS FOR THE PARTIAL TREATMENT OF ELONGATED ARTICLES BY CURRENT INTENSIVE GLOW DISCHARGE

[76] Inventors: Werner Oppel, Saarstrasse 46, Rodenkirchen, Fed. Rep. of Germany; Horst Rordorf, Ifang 17, Weiningen, Switzerland

[21] Appl. No.: 4,837

[22] Filed: Jan. 19, 1979

[30] Foreign Application Priority Data

Jan. 26, 1978 [DE] Fed. Rep. of Germany ....... 2803331

[51] Int. Cl.² ............... C23C 11/10; C23C 11/14
[52] U.S. Cl. ............... 250/531; 148/16.5; 148/16.6; 219/6.5; 219/10.43; 266/252; 266/258; 422/186
[58] Field of Search ............... 250/531, 492 B; 204/164, 177; 148/16.6, 16.5; 219/6.5, 10.43; 266/252, 258; 422/186

[56] References Cited

U.S. PATENT DOCUMENTS

| 3,308,049 | 3/1967 | Jones et al. | 250/531 |
| 3,654,108 | 4/1972 | Smith | 250/531 |
| 3,730,863 | 5/1973 | Keller | 204/164 |
| 3,761,370 | 9/1973 | Keller | 204/164 |

*Primary Examiner*—Deborah L. Kyle
*Attorney, Agent, or Firm*—Bacon & Thomas

[57] ABSTRACT

An outer receptacle has at least one opening for receiving an elongated article to be treated and an inner metal container, within the receptacle, is arranged to around only that portion of the article that is to receive treatment. An electrode in and insulated from the metal container is spaced from the article so that the receptacle, container and article can be held at one potential while a different potential is applied to the electrode to produce a glow discharge and heat only that portion of the article within the metal container. The structure also provides for introducing a selected gas into the container and receptacle.

5 Claims, 3 Drawing Figures

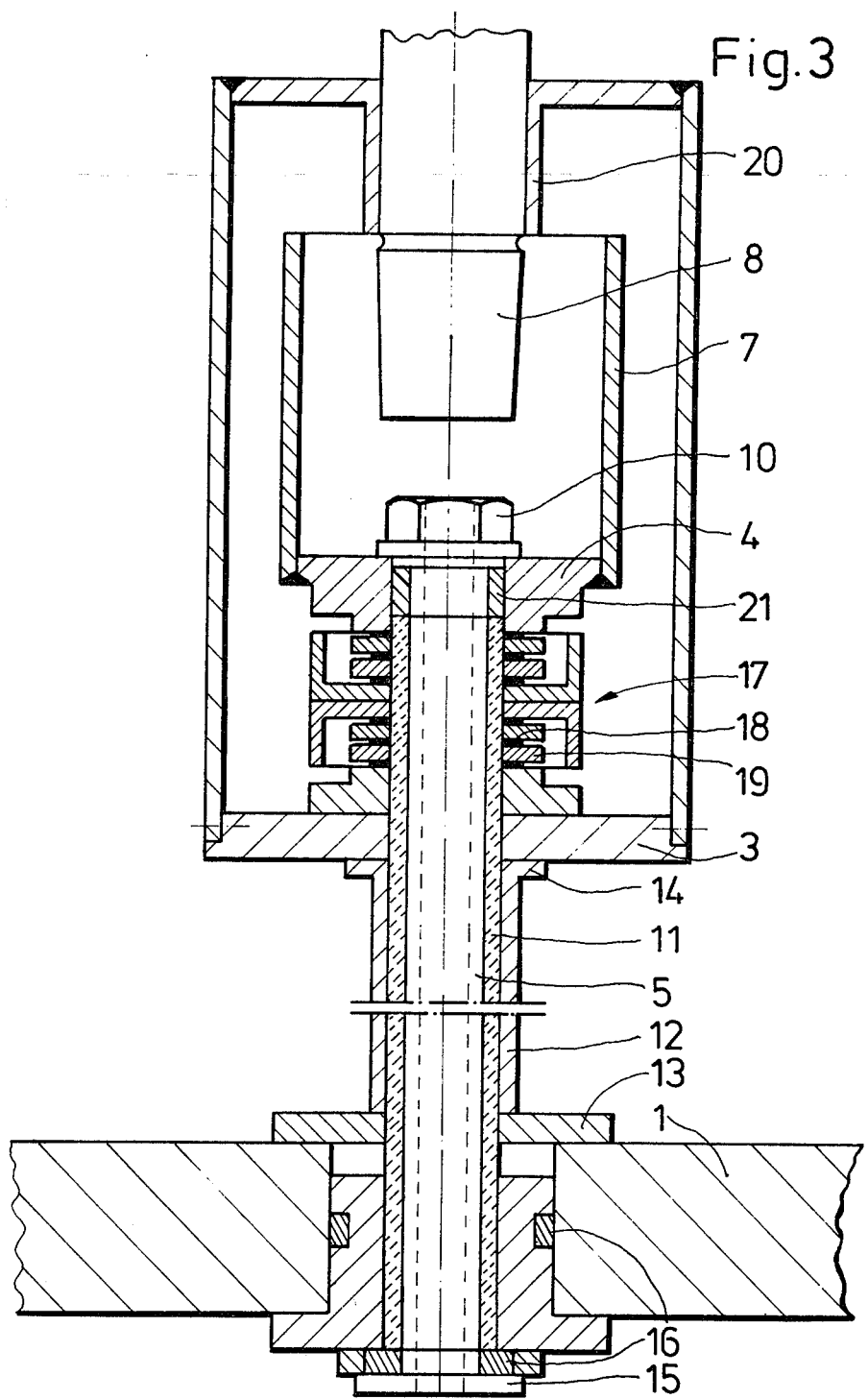

APPARATUS FOR THE PARTIAL TREATMENT OF ELONGATED ARTICLES BY CURRENT INTENSIVE GLOW DISCHARGE

BACKGROUND OF THE INVENTION

This invention concerns an apparatus for the partial treatment of elongated articles by current intensive glow discharge with a receptacle and a direct current source, which can be connected with the article and the receptacle.

In the treatment of articles by current intensive glow discharge, for example, for the purpose of nitriding, carbonitriding, carburizing, metallizing, annealing or the like, the articles are arranged in a receptacle which is evacuated, whereupon the articles are heated to the treatment temperature indirectly by external heating or directly by glow discharge and are then treated for a predetermined time period, possibly by the use of a treatment gas, which flows through the receptacle. If certain areas of an article, which should be nitrided, are to remain soft, these areas are covered by sheetmetal or the like or coated with a copper paste, so that nitride hardening will not take place in these areas. However, if elongated articles are to be treated only partly, for example, only the thread of pipes of a drill pipe, the insertion of the entire pipe into a correspondingly large receptacle, as well as the application of a protection for the areas of the article, which should not be treated, would result in a disproportionately high energy consumption because the entire article is heated to the treatment temperature, while only a small part is to be treated. Furthermore, a relatively large amount of labor would be required for the application of the protection and a very large receptacle would be required, with a correspondingly extensive high power current supply and appropriately designed vacuum pumps. On the basis of the large volume of the receptacle, the consumption of gas would be correspondingly large and a strong suspension for the article would also be required.

SUMMARY OF THE INVENTION

It is the objective of this invention to provide an apparatus of the initially described type, which makes it possible to treat elongated articles in partial areas with a minimum of effort.

This problem is solved by providing that the wall of the receptacle has at least one opening for the article, while, within the receptacle, a metal container is arranged, which is grounded, together with the receptacle and the article and into which the part of the article, which is to be treated, can be introduced, whereby, inside of the container, there is an inner electrode, which can be connected with the other pole of the direct current source.

In this apparatus, the article, with the part which is to be treated, can be arranged inside of the metal container, whereby, for the purpose of the treatment of the part of the article, which is to be treated, the latter and the inside of the container are subjected to glow discharge. The article, which extends outside of the receptacle, as well as the receptacle, are at ground potential, so that this will not represent any danger for operating personnel and, furthermore, it is not necessary to take any safety precautions, for example, in the form of protective coverings.

In the case of drill pipes, it has been found, that a hardening of the threads of the individual pipes is of advantage in order to prevent freezing of these threads so that, in the widthdrawal of the drill pipes, it results in a better release of the pipes from each other and thus a considerably reduced time consumption, but the threads of the drill pipes must always be rehardened for this purpose. With the apparatus in accordance with this invention, this becomes possible at the drilling site. In particular, only a very small receptacle with correspondingly small current supply, gas supply and vacuum pump systems is required for this purpose, so that this apparatus can even be used on drilling platforms or the like, where very cramped conditions prevail. Especially in this case, it is important that the pipe extending from the receptacle be at ground potential to thus avoid a source of danger.

Additional embodiments of the invention are contained in the dependent claims.

BRIEF DESCRIPTION OF THE DRAWINGS

In the following, the invention is described in greater detail by means of the embodiments, which are illustrated in the attached drawings.

FIG. 3 shows, in partial section, an embodiment for the receptacle for the apparatus of FIG. 1.

DESCRIPTION OF THE PREFERRED EMBODIMENT

Figure 1:
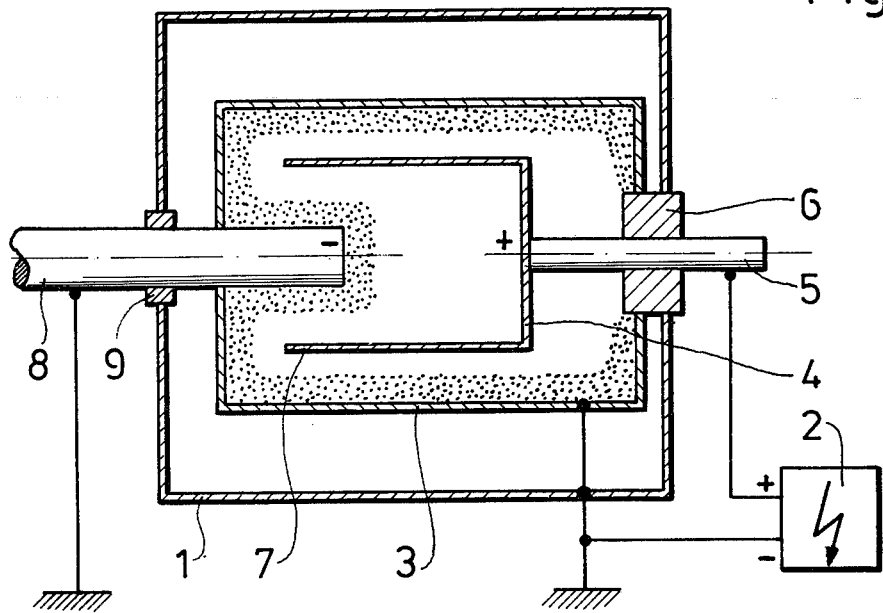
FIG. 1 schematically shows an apparatus in accordance with this invention for the treatment of the end portion of an elongated article.

The apparatus illustrated in FIG. 1 consists of a receptacle 1, a direct current source 2, a device for evacuating receptacle 1 (not illustrated), as well as a gas supply device, which is connected to the receptacle, for the supply of the treatment gas necessary for the treatment of the articles (also not illustrated). Within the receptacle, a metal container 3 is arranged, which is at the same potential as receptacle 1, namely ground potential. Within container 3, an inner electrode 4 is located, which is connected to the other pole of direct current source 2, whereby the inner electrode is provided with a supply line 5, which goes through the wall of container 3 and receptacle 1 and is insulated with respect to the latter by means of an insulating device 6. In the embodiment of FIG. 1, the inner electrode 4 is configured in the form of a cylindrical pot 7 within container 3. An article 8, which is to be treated and which is also at ground potential, is fed through the wall of receptacle 1 and container 3 so that pot 7 of the inner electrode 4 surrounds the part of the article 8, which is to be treated at least partly at a distance. A vacuum seal 9 is provided at the opening, through which article 8 is introduced into receptacle 1.

If article 8, which is to be treated, is a pipe, its inner bore must also be provided with a vacuum seal in order to prevent the penetration of air into receptacle 1.

The feeding of the treatment gas necessary for the treatment of article 8 can be carried out, for example, through supply line 5 for the inner electrode 4, the supply line 5 then would be of a tubular configuration and connected to the gas supply device. The exhaust of the gas from receptacle 1 can be outside and/or inside container 3; container 3 does not need to be sealed with respect to the surrounding receptacle 1; rather, it can also have openings for the passage of gas. For example, container 3 can consist of a wire mesh with a narrow mesh or of a perforated sheet, or even of a cylinder or the like.

The heating can be carried out directly or indirectly, i.e. by means of glow discharge of the part of article 8 which is to be treated (direct heating) or by means of glow discharge of the inner electrode 4, of which the heat radiation results in the heating of the part of article 8 to be treated (indirect heating). The latter has the advantage in that contaminations of the surface of article 8 connot result in the occurrence of discharge disturbances, such as arcs, during the heating, so that a trouble-free and uniform starting process is assured. For the purpose of indirect heating, the inner electrode 4 must be connected with the negative pole of the direct current source 2, while receptacle 1, the article 8 and container 3 are connected to the positive pole of direct current source 2 and are simultaneously at ground potential. In this manner, the part of the elongated article 8, which extends beyond receptacle 1 has a ground potential. At the beginning of the treatment itself (FIG. 1), in which the part of article 8, which is to be treated, is to be subject to glow discharge, pole reversal must be carried out, whereby the inner electrode 4 is connected to the positive pole of direct current source 2, while receptacle 1, container 3 and article 8 are connected to the negative pole of the direct current source 2, but remain grounded.

Figure 2:
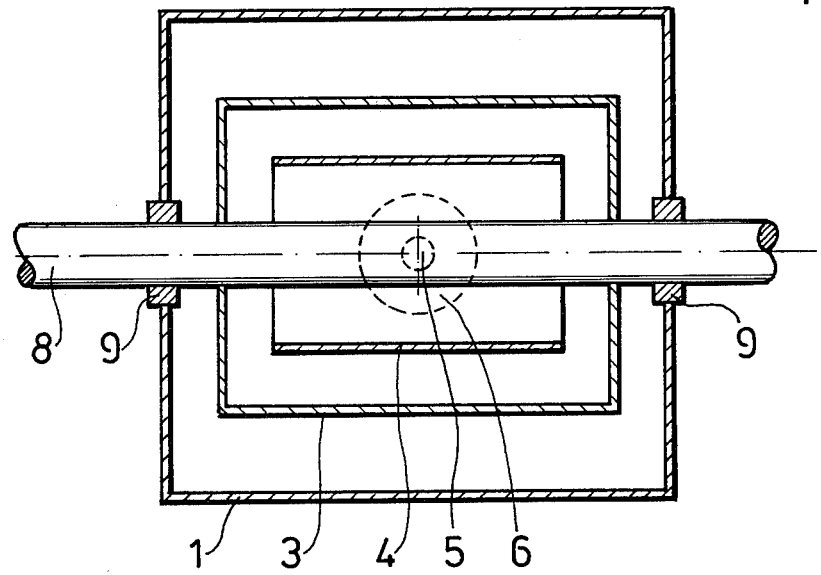
FIG. 2 schematically shows an apparatus in accordance with this invention for the treatment of a middle portion of an elongated article.

In accordance with FIG. 2, a middle portion of an elongated article 8 is to be treated by glow discharge, whereby this middle portion of article 8, which is to be treated, is within an open ended cylindrical inner electrode 4. Here also, the heating can be carried out directly or indirectly.

In accordance with FIG. 3, a tubular supply line 5, which is secured by means of a nut 10, is fed through an opening in the wall of receptacle 1. Supply line 5 is surrounded by a ceramic tube 11 which in turn is in a metal casing 12 and which itself extends through a disc 13 and is spaced with respect to the wall of receptacle 1. Tube 11 then passes through a flanged neck 14 spaced with respect to container 3. Tightening is carried out by means of screw 10 with the aid of a shoulder 15 of supply line 5. Due to ceramic tube 11, container 3 is insulated with respect to the supply line, but is connected with the wall of receptacle 1 through outer casing 12 and disc 13. Seals 16 provide a vacuum tight feed-in through feed line 5. Between the inside of the container 3, adjacent to ceramic tube 11 and the end wall of inner electrode 4, a gap system 17 built up by components 19, which are separated from each other by mica disc, which are at floating potential, is located. The gap system 17 prevents a conducting metal film, which could result in a galvanic short-circuit, from forming between inner electrode 4 and container 3. Container 3 has an inwardly directed tubing 20, into which article 8, which is to be treated, can be inserted and by which it can be held, while the part of article 8, which is to be treated, extends into pot 7 of the inner electrode 4 and can be treated in this manner. Nut 10, which together with a sleeve 21 provides the electrical contact between supply line 5 and the inner electrode 4 and also assures tightening, has a bore corresponding to the tubular supply line 5 in order to assure the input of the treatment gas into the inside of the inner electrode 4 adjacent to the part of article 8, which is to be treated.

We claim:

1. Apparatus for the metallurgical treatment of a selected portion of an elongated article, by glow discharge heating comprising:

an outer receptacle having at least one opening for passage of the article; a metal container within said receptacle arranged to receive that selected portion of said article;

an inner electrode, within said container, spaced from said selected portion and electrically insulated from said receptacle, container and article; and cathode means for applying one direct current potential to said receptacle, container and article and anode means for applying another potential to said electrode to produce a glow discharge between said electrode and said selected portion.

2. Apparatus as defined in claim 1 including means for maintaining said receptacle, container and article at ground potential, however, allowing to change the direct current potential polarity of said receptacle, container, article and inner electrode, respectively.

3. Apparatus as defined in claim 1 including means for introducing a selected treatment gas into said container.

4. Apparatus as defined in claim 3 wherein said means for introducing gas into said container is a tubular and conductive member connected to said electrode and serving to connect said electrode to a source of direct current potential.

5. Apparatus as defined in claim 1 wherein said electrode is a hollow cylinder spaced from and extending around said selected portion of said elongated article.

* * * * *